US012382726B2

United States Patent
Mikhalev et al.

(10) Patent No.: US 12,382,726 B2
(45) Date of Patent: Aug. 5, 2025

(54) CAPACITOR STRUCTURES

(71) Applicant: Lodestar Licensing Group LLC, Evanston, IL (US)

(72) Inventors: Vladimir Mikhalev, Boise, ID (US); Michael P. Violette, Boise, ID (US)

(73) Assignee: Lodestar Licensing Group LLC, Evanston, IL (US)

( * ) Notice: Subject to any disclaimer, the term of this patent is extended or adjusted under 35 U.S.C. 154(b) by 0 days.

(21) Appl. No.: 18/439,676

(22) Filed: Feb. 12, 2024

(65) Prior Publication Data
US 2024/0186313 A1 Jun. 6, 2024

Related U.S. Application Data

(63) Continuation of application No. 18/096,222, filed on Jan. 12, 2023, now Pat. No. 11,935,883, which is a
(Continued)

(51) Int. Cl.
*H10D 89/60* (2025.01)
*G11C 7/24* (2006.01)
(Continued)

(52) U.S. Cl.
CPC ............. *H10D 89/60* (2025.01); *G11C 7/24* (2013.01); *G11C 16/0483* (2013.01);
(Continued)

(58) Field of Classification Search
None
See application file for complete search history.

(56) References Cited

U.S. PATENT DOCUMENTS 5,012,305 A    4/1991  Khadder et al.
5,602,046 A    2/1997  Calafut et al.
(Continued)

FOREIGN PATENT DOCUMENTS

CN    104769691 A    7/2015
JP    62-154661 A    7/1987
(Continued)

OTHER PUBLICATIONS

Chinese First Office Action for Chinese Application No. 202080041000.X, dated Aug. 31, 2023, 10 pages with translation.
(Continued)

*Primary Examiner* — Feifei Yeung Lopez
(74) *Attorney, Agent, or Firm* — TraskBritt

(57) ABSTRACT

A capacitor structure comprises a first conductive region having a first conductivity type and a second conductive region having a second conductivity type different than the first conductivity type. The first conductive region comprises a first protrusion portion and a second protrusion portion. The second conductive region comprises a protrusion portion. The capacitor structure further comprises a first dielectric overlying the first protrusion portion of the first conductive region, and a first conductor overlying the first dielectric. Additionally, the capacitor structure comprises a terminal of a diode overlying the second protrusion portion of the first conductive region and the protrusion portion of the second conductive region. The terminal of the diode comprises a second conductor isolated from the first conductor.

19 Claims, 14 Drawing Sheets

Related U.S. Application Data continuation of application No. 17/358,251, filed on Jun. 25, 2021, now Pat. No. 11,569,221, which is a continuation of application No. 16/454,908, filed on Jun. 27, 2019, now Pat. No. 11,063,034.

(51) Int. Cl.

| | |
|---|---|
| *G11C 16/04* | (2006.01) |
| *G11C 16/30* | (2006.01) |
| *H01L 23/60* | (2006.01) |
| *H01L 23/62* | (2006.01) |
| *H10B 41/20* | (2023.01) |
| *H10B 41/40* | (2023.01) |
| *H10B 43/20* | (2023.01) |
| *H10B 43/40* | (2023.01) |
| *H10D 1/68* | (2025.01) |
| *H10D 8/25* | (2025.01) |
| *H10D 62/83* | (2025.01) |
| *H10D 64/62* | (2025.01) |

(52) U.S. Cl.
CPC ............ *G11C 16/30* (2013.01); *H01L 23/60* (2013.01); *H01L 23/62* (2013.01); *H10B 41/20* (2023.02); *H10B 41/40* (2023.02); *H10B 43/20* (2023.02); *H10B 43/40* (2023.02); *H10D 1/692* (2025.01); *H10D 8/25* (2025.01); *H10D 62/83* (2025.01); *H10D 64/62* (2025.01); *H10D 89/921* (2025.01)

(56) References Cited

U.S. PATENT DOCUMENTS

| | | | |
|---|---|---|---|
| 5,642,252 A | 6/1997 | Sakamoto et al. | |
| 6,215,170 B1 | 4/2001 | Blanchard | |
| 6,329,260 B1 | 12/2001 | Dejong et al. | |
| 6,344,385 B1 | 2/2002 | Jun et al. | |
| 6,365,932 B1 | 4/2002 | Kouno et al. | |
| 7,750,439 B2 | 7/2010 | Inoue | |
| 2002/0009851 A1 | 1/2002 | Shukuri et al. | |
| 2011/0095320 A1 | 4/2011 | Hwang | |
| 2011/0248300 A1 | 10/2011 | Hwang | |
| 2012/0133025 A1 | 5/2012 | Clarke et al. | |
| 2012/0161232 A1 | 6/2012 | Farbiz et al. | |
| 2013/0148243 A1 | 6/2013 | Tsujikawa | |
| 2013/0328114 A1 | 12/2013 | Banerjee et al. | |
| 2016/0211077 A1* | 7/2016 | Yamamoto | H10B 63/20 |
| 2018/0047717 A1 | 2/2018 | Wang et al. | |

FOREIGN PATENT DOCUMENTS

| | | |
|---|---|---|
| JP | 2012-059830 A | 3/2012 |
| JP | 2014-187136 A | 10/2014 |
| WO | 2005/017982 A1 | 2/2005 |
| WO | 2014/069363 A1 | 5/2014 |
| WO | 2018/174191 A1 | 9/2018 |

OTHER PUBLICATIONS

European Extended Search Report and Opinion for European Application No. 20831912.9, dated May 30, 2023, 8 pages.
International Preliminary Report on Patentability received for PCT Patent Application No. PCT/US20/38033, mailed on Jan. 6, 2022, 5 pages.
International Search Report for International Application No. PCT/US20/38033, mailed Sep. 25, 2020, 3 pages.
International Written Opinion for International Application No. PCT/US20/38033, mailed Sep. 25, 2020, 3 pages.
Japanese Notice of Reasons for Refusal for Japanese Application No. 2021-576781, dated Jan. 17, 2023, 6 pages with English translation.
Korean Notice of Preliminary Rejection for Korean Application No. 10-2021-7039833, dated Jun. 19, 2023, 9 pages with English translation.

* cited by examiner

CAPACITOR STRUCTURES

CROSS-REFERENCE TO RELATED APPLICATIONS

This Application is a Continuation of U.S. application Ser. No. 18/096,222, filed Jan. 12, 2023, now U.S. Pat. No. 11,935,883, issued Mar. 19, 2024, which is a continuation of U.S. application Ser. No. 17/358,251, filed Jun. 25, 2021, now U.S. Pat. No. 11,569,221, issued Jan. 31, 2023, which is a continuation of U.S. application Ser. No. 16/454,908, filed Jun. 27, 2019, issued as U.S. Pat. No. 11,063,034 on Jul. 13, 2021, the disclosure of each of which is hereby incorporated herein in its entirety by this reference.

TECHNICAL FIELD

The present disclosure relates generally to integrated circuit elements, and, in particular, in one or more embodiments, the present disclosure relates to capacitor structures for integrated circuit devices.

BACKGROUND

Integrated circuit devices traverse a broad range of electronic devices. One particular type includes memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Integrated circuit devices generally include capacitors in a variety of uses. For example, decoupling capacitors might be connected between power busses and a ground. In addition, voltage generation devices might utilize coupling capacitors and storage capacitors in the generation and regulation of an output voltage level, either positive or negative. Where such capacitors are damaged during fabrication of an integrated circuit device, that integrated circuit device might become unusable.

DETAILED DESCRIPTION

Figure 1:
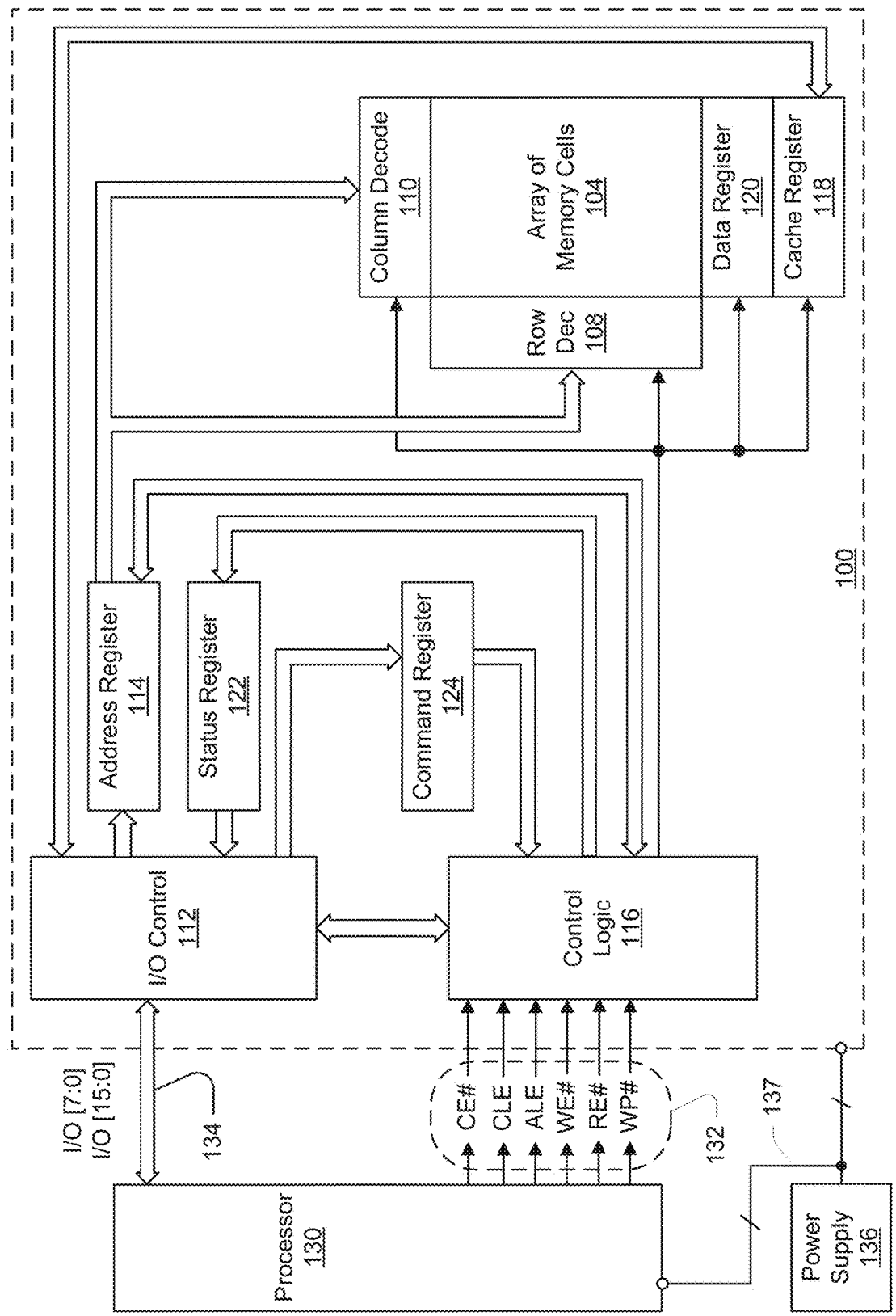
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which may include read operations and verify operations], programming operations and/or erase operations) on the array of memory cells 104, and might be configured to perform methods in accordance with embodiments. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

Memory device 100 and/or processor 130 may receive power from a power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two. Power is typically received from the power supply 136 using two or more voltage supply nodes 137, such as a supply voltage node (e.g., Vcc or Vccq) and a reference voltage node (e.g., Vss or Vssq, such as ground or 0 V). It is not uncommon for a power supply 136 to provide more than two voltage supply nodes 137. For simplicity, distribution of power from the voltage supply nodes 137 to components within the memory device 100 is not depicted.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
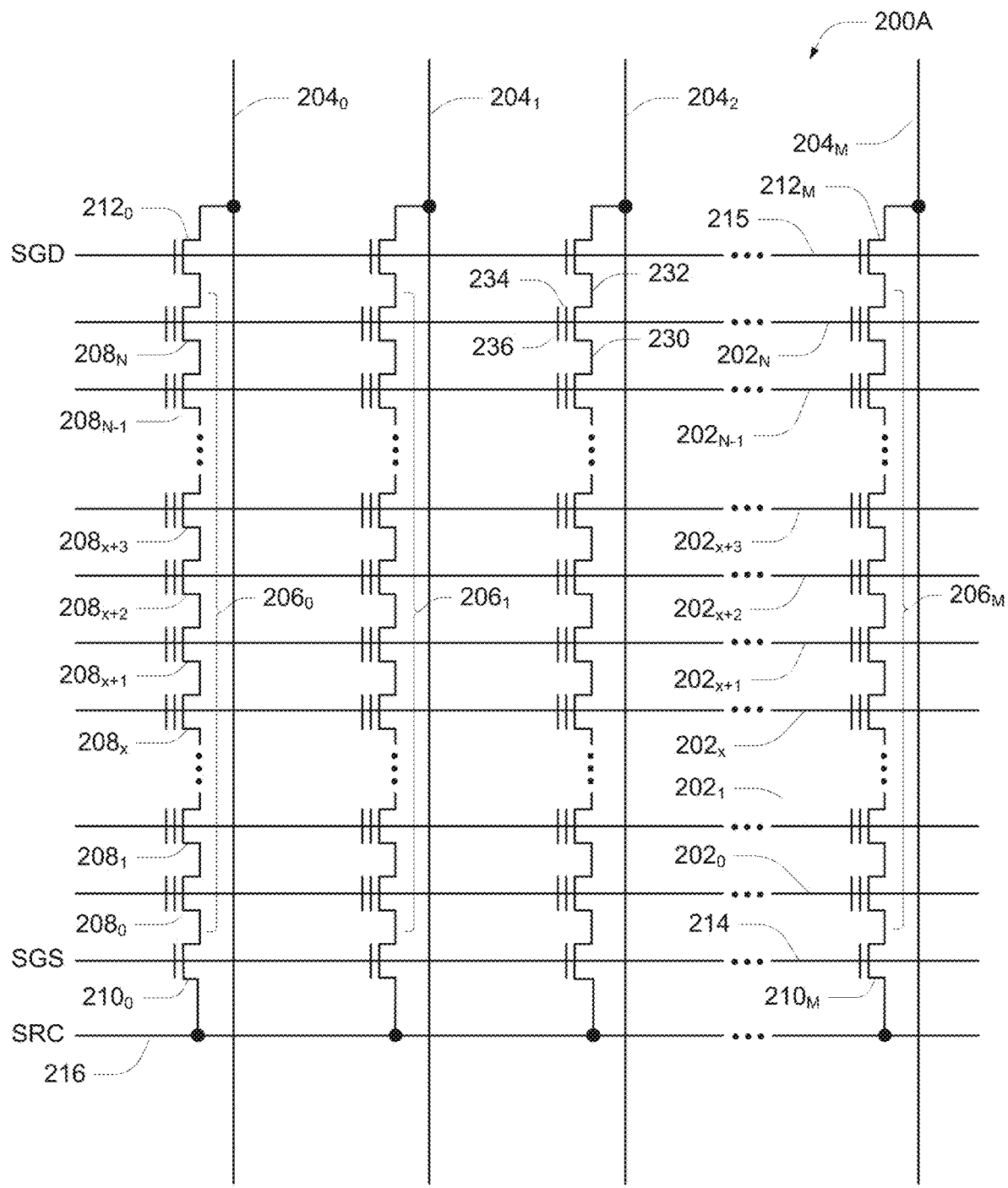
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
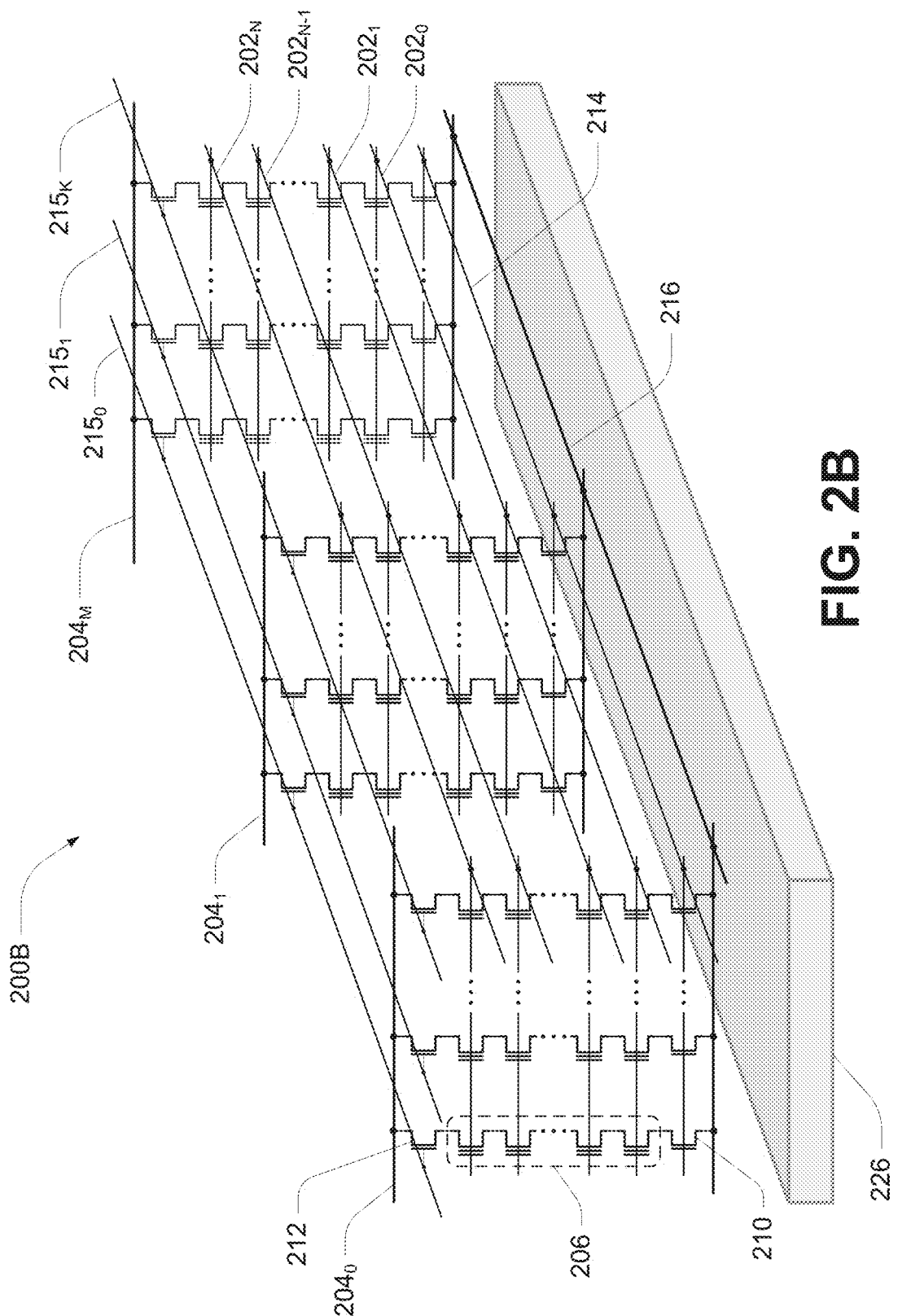

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience. The peripheral circuitry 226 might further include capacitor structures (not shown in FIG. 2B) in accordance with embodiments for use as decoupling capacitors, coupling capacitors and/or storage capacitors.

Figure 3A:
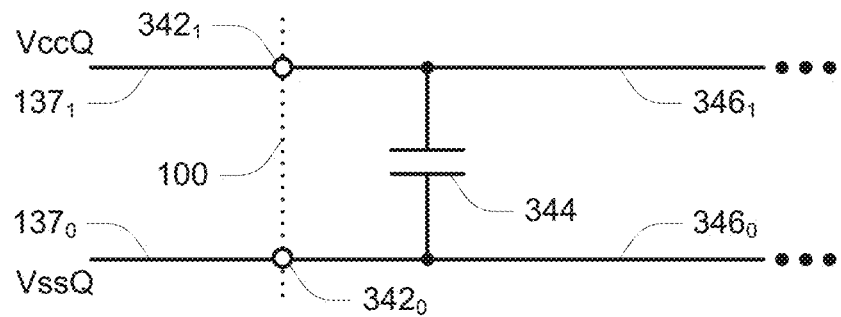
FIGS. 3A-3E are schematics of portions of an integrated circuit device having a capacitor in accordance with an embodiment.
Figure 3B:
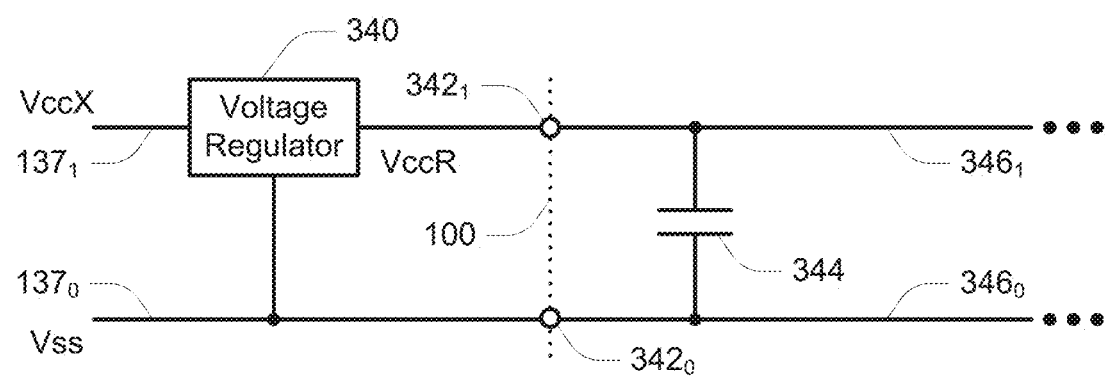
Figure 3C:
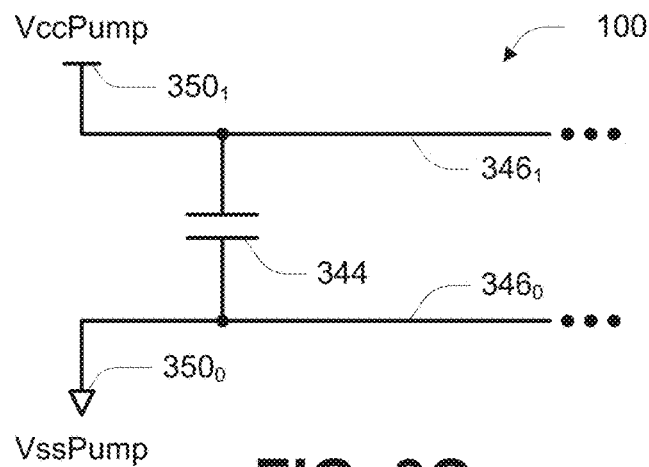
Figure 3D:
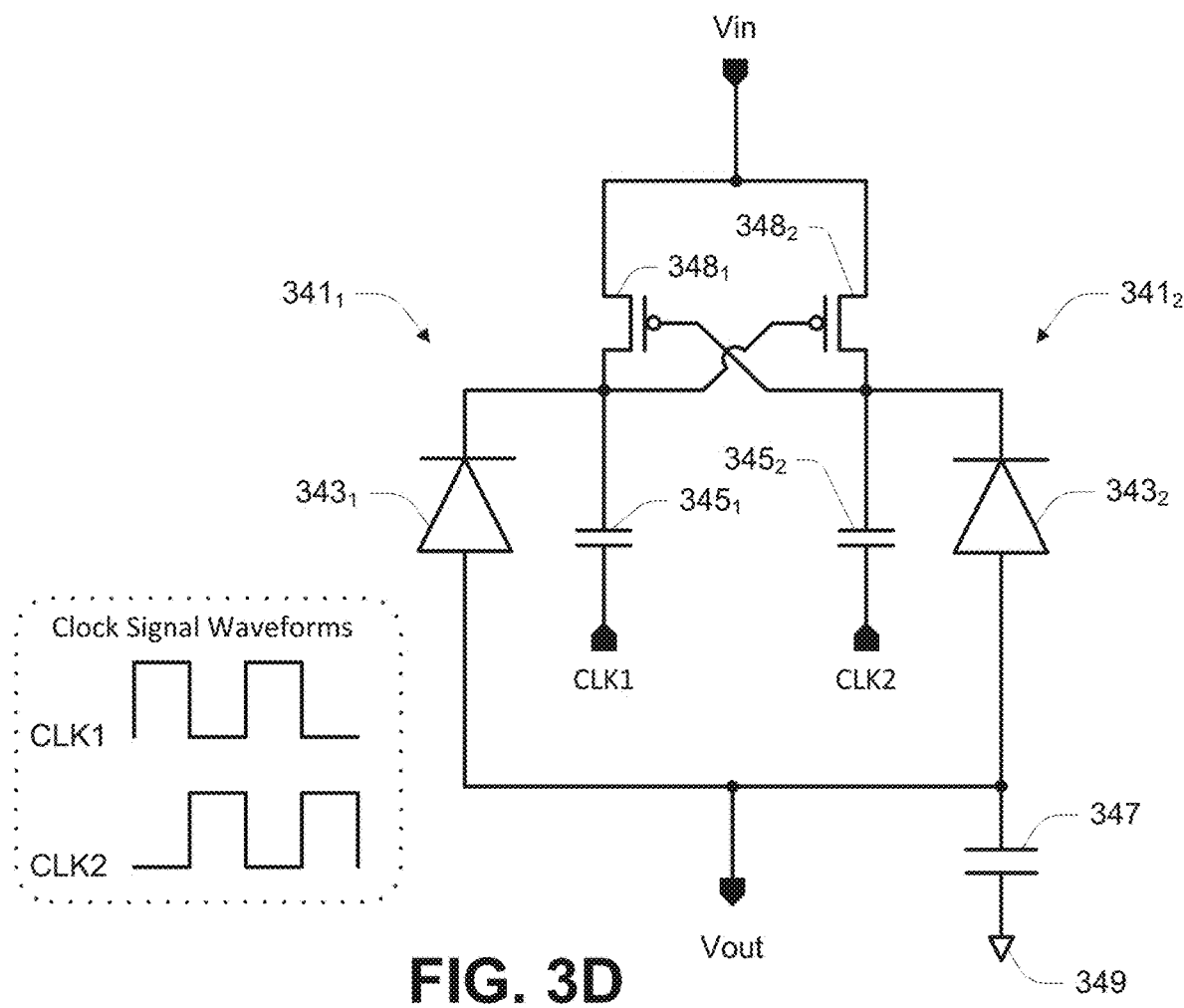
Figure 3E:
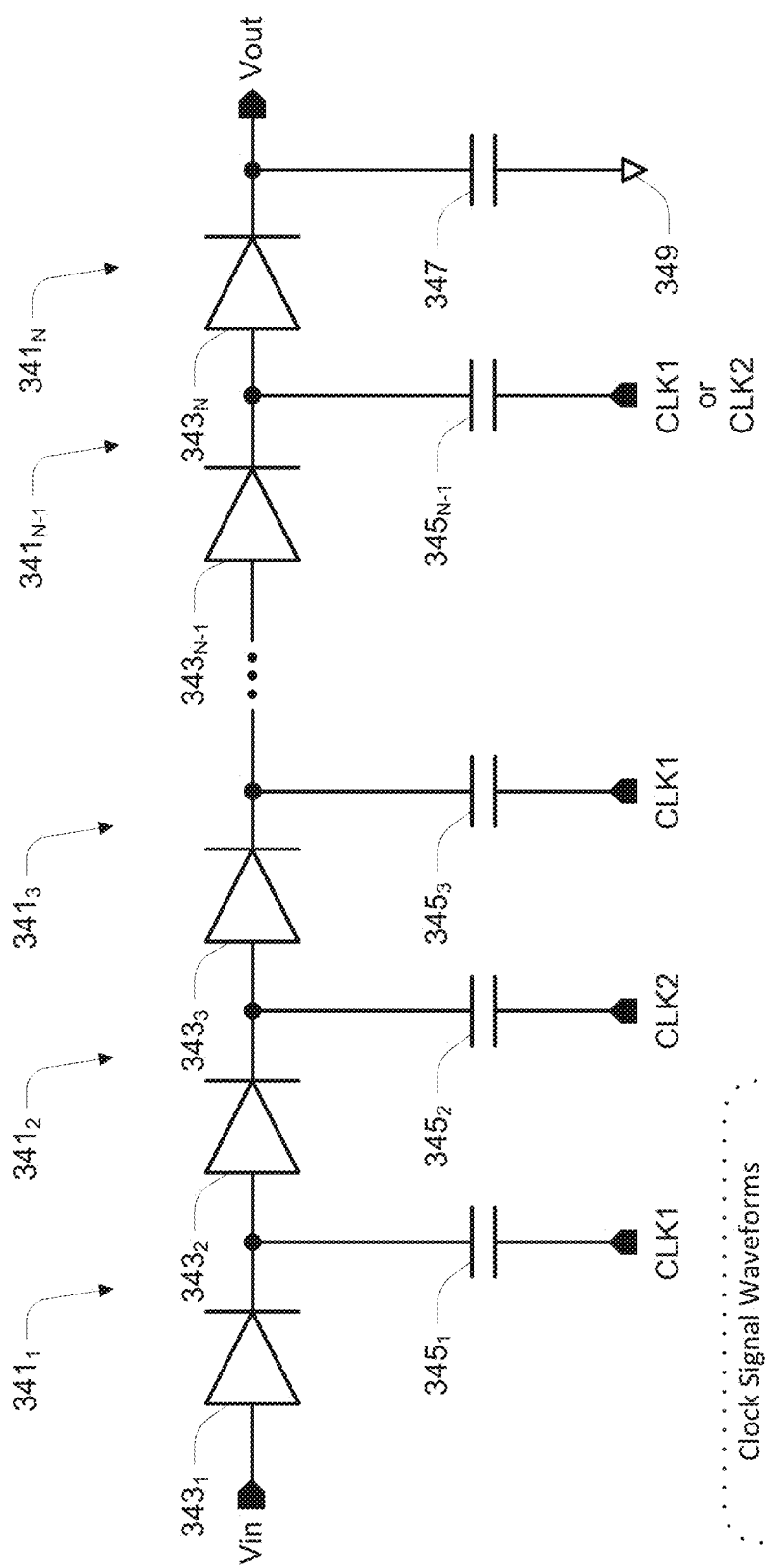

FIGS. 3A-3E are schematics of portions of an integrated circuit device having a capacitor in accordance with an embodiment. FIGS. 3A-3C depict examples of the use of decoupling capacitors between power rail voltages within an integrated circuit device, while FIGS. 3D and 3E depict examples of the use of coupling capacitors and storage capacitors within voltage generation circuits of an integrated circuit device. Voltage generation circuits typically increase or decrease an input supply voltage in order to provide a higher or lower output voltage, respectively, required to operate circuit elements in integrated circuits. The decoupling capacitors, coupling capacitors and/or storage capacitors as described below might be distributed among the peripheral circuitry 226 of three-dimensional NAND memory array 200B of FIG. 2B, for example.

FIG. 3A depicts voltage supply nodes $137_0$ and $137_1$ connected to conductive nodes $342_0$ and $342_1$, respectively, of a memory device 100. The conductive nodes $342_0$ and $342_1$ might each represent conductive nodes providing for electrical connection to the memory device 100 by an external device (e.g., processor 130), such as conductive pads or conductive bumps as are commonly used. The voltage supply node $137_0$ might be configured to supply a bottom rail supply voltage, such as VssQ, while the voltage supply node $137_1$ might be configured to supply a low top rail supply voltage, such as VccQ. As an example, VssQ and VccQ might represent power rails for a data path of the memory device 100. As a further example, typical values of VssQ might be 0V or ground, while a typical value of VccQ might be 1.2V. The conductive nodes $342_0$ and $342_1$ might be connected to conductors $346_0$ and $346_1$, respectively, for distributing the rail voltages to various circuitry of the memory device 100. One or more decoupling capacitors 344 might be connected between the conductors $346_0$ and $346_1$ to decouple high frequency noise from the rail voltages. Such decoupling capacitors 344 might be distributed across a die containing the memory device 100 between conductors carrying VccQ and VssQ in order to mitigate VccQ bus noise during high-speed data communications.

FIG. 3B depicts voltage supply node $137_0$ connected to a first input of a voltage regulator 340 and connected to conductive node $342_0$ of a memory device 100. FIG. 3B further depicts voltage supply node $137_1$ connected to a second input of the voltage regulator 340, which has an output connected to conductive node $342_1$. The conductive nodes $342_0$ and $342_1$ might each represent conductive nodes providing for electrical connection to the memory device 100 by an external device (e.g., processor 130 and/or voltage regulator 340), such as conductive pads or conductive bumps as are commonly used. The voltage supply node $137_0$ might be configured to supply a bottom rail supply voltage, such as Vss, while the voltage supply node $137_1$ might be configured to supply a top rail supply voltage, such as VccX. The voltage regulator 340 might be configured to generate a regulated top rail voltage VccR. As an example, Vss and VccR might represent power rails for operation of internal logic of the memory device 100. As a further example, typical values of Vss might be 0V or ground, and typical values of VccX might be 2.4-3.6V, while typical values of VccR might be 2.2-2.3V. The conductive nodes $342_0$ and $342_1$ might be connected to conductors $346_0$ and $346_1$, respectively, for distributing the rail voltages to various circuitry of the memory device 100. One or more decoupling capacitors 344 might be connected between the conductors $346_0$ and $346_1$ to decouple high frequency noise from the rail voltages. Such decoupling capacitors 344 might be distributed across a die containing the memory device 100 between conductors carrying VccR and Vss in order to mitigate VccR bus noise from the internal logic of the memory device 100.

FIG. 3C depicts voltage node $350_0$, which might be a voltage node internal to the memory device 100 and configured to supply a bottom rail voltage, such as VssPump, while the voltage node $350_1$ might be a voltage node internal to the memory device 100 and configured to supply a top rail voltage, such as VccPump. As an example, VssPump and VccPump might represent power rails received from a voltage generation circuit of the memory device 100. As a further example, typical values of VssPump might be 0V or ground, and typical values of VccPump might be 15-32V. The voltage nodes $350_0$ and $350_1$ might be connected to conductors $346_0$ and $346_1$, respectively, for distributing the rail voltages to various circuitry of the memory device 100.

One or more decoupling capacitors 344 might be connected between the conductors $346_0$ and $346_1$ to decouple high frequency noise from the rail voltages.

FIG. 3D depicts an example of a negative charge pump, e.g., for developing a decreasing voltage level at its output. The charge pump of FIG. 3D receives an input voltage Vin. A first clock signal CLK1 may be received at one input of coupling capacitor $345_1$, while a second clock signal CLK2 may be received at one input of coupling capacitor $345_2$. Clock signals CLK1 and CLK2 would generally have opposite phases, the same frequency, and similar (e.g., the same) amplitudes, which may correspond to the amplitude of a supply voltage. Although the coupling capacitors $345_0$ and $345_1$ are each depicted as single capacitors, one or both might alternatively each represent multiple capacitors connected in parallel.

The charge pump of FIG. 3D might include two parallel stages 341. The stages $341_1$ and $341_2$ may each include a coupling capacitor $345_1$ and $345_2$, respectively. The stages $341_1$ and $341_2$ may further include a voltage isolation device $343_1$ and $343_2$, respectively, e.g., a transistor configured to function as a diode. The voltage isolation devices 343 may be included to protect a load, e.g., circuitry configured to receive the output voltage Vout. In the charge pump of FIG. 3D, the voltage isolation devices 343 may generally mitigate charge or discharge of the coupling capacitors 345 between cycles of their respective clock signal CLK1 or CLK2. Cross-coupled transistors (e.g., p-type field effect transistors) $348_1$ and $348_2$ may be included to discharge their respective coupling capacitor $345_1$ and $345_2$ while their respective clock signal CLK1 and CLK2 is logic high (e.g., due to the capacitive effect of the logic low level of the complementary clock signal), and to isolate their respective coupling capacitor $345_1$ and $345_2$ when their respective clock signal CLK1 and CLK2 transitions to logic low. Thus, the charge pump of FIG. 3D may progressively remove charge from the coupling capacitor 345 of each stage, and can produce a decreasing voltage level. A storage capacitor 347 might be connected between the output of the charge pump of FIG. 3D and a voltage node (e.g., ground node) 349. Although the storage capacitor 347 is depicted as a single capacitor, it might alternatively represent multiple capacitors connected in parallel.

FIG. 3E depicts an example of a positive charge pump, e.g., for developing an increasing voltage level at its output. The charge pump of FIG. 3E receives an input voltage Vin, which might be Vcc for example. A first clock signal CLK1 may be received at one input (e.g., electrode) of alternating coupling capacitors, e.g., coupling capacitors $345_1$, $345_3$, $345_5$, etc., while a second clock signal CLK2 may be received at one input (e.g., electrode) of alternating coupling capacitors, e.g., coupling capacitors $345_2$, $345_4$, $345_6$, etc. While coupling capacitors $345_4$, $345_5$ and $345_6$ are not directly shown in FIG. 3E, it is apparent from the numbering of coupling capacitors 345 from 1 to N. Although the coupling capacitors 345 are each depicted as single capacitors, one or more might alternatively each represent multiple capacitors connected in parallel. Clock signals CLK1 and CLK2 would generally have opposite phases, the same frequency, and similar (e.g., the same) amplitudes, which may correspond to the amplitude of a supply voltage.

The charge pump of FIG. 3E may include N stages 341. The stages $341_1$ through $341_{N-1}$ may each include a coupling capacitor 345. The stages $341_1$ through $341_N$ may further include a voltage isolation device 343, e.g., a diode. The Nth stage $341_N$ of the charge pump of FIG. 3E may contain voltage isolation device $343_N$ without a corresponding coupling capacitor 345. The voltage isolation device $343_N$ may be included to protect a load, e.g., circuitry configured to receive the output voltage Vout. In the charge pump of FIG. 3E, the voltage isolation devices 343 may generally mitigate charge or discharge of the coupling capacitors 345 between cycles of their respective clock signal CLK1 or CLK2. Thus, the charge pump of FIG. 3E may progressively store more charge on the coupling capacitor of each stage, and several such stages being placed together in the charge pump can produce an increasing voltage level. A storage capacitor 347 might be connected between the output of the charge pump of FIG. 3E and a voltage node, e.g., ground node, 349. Although the storage capacitor 347 is depicted as a single capacitor, it might alternatively represent multiple capacitors connected in parallel.

The various uses of capacitors described with reference to FIGS. 3A-3E may be critical to effective operation of the integrated circuit device in which they are contained. However, charge build-up within the capacitors may occur during fabrication, and uncontrolled discharge of such charge build-up can punch through the dielectric of a capacitor, which can create a conductive path between its electrodes, effectively destroying that capacitor.

Figure 4A:
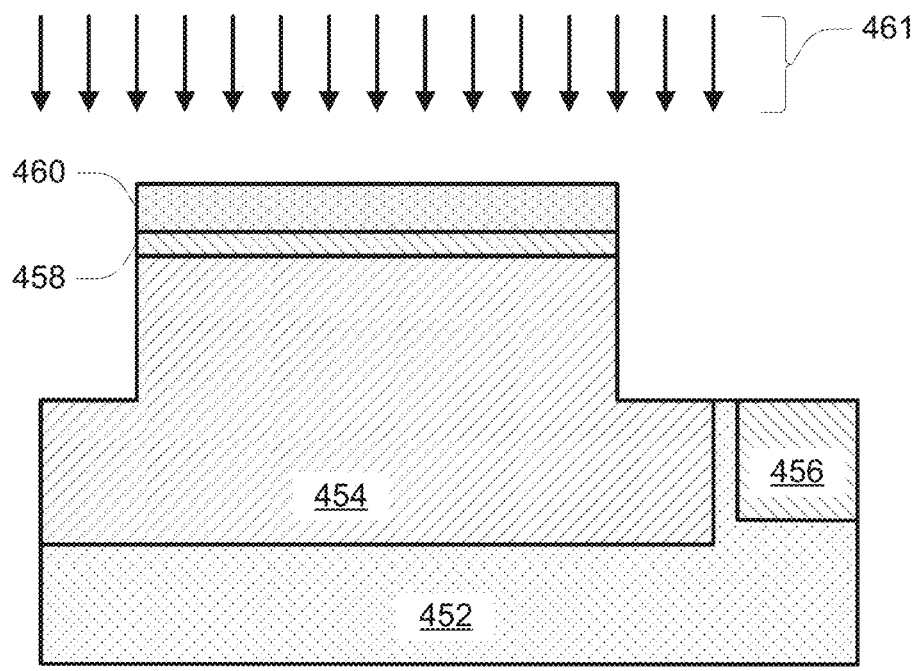
FIGS. 4A-4B are cross-sectional views of a capacitor of the related art.
Figure 4B:
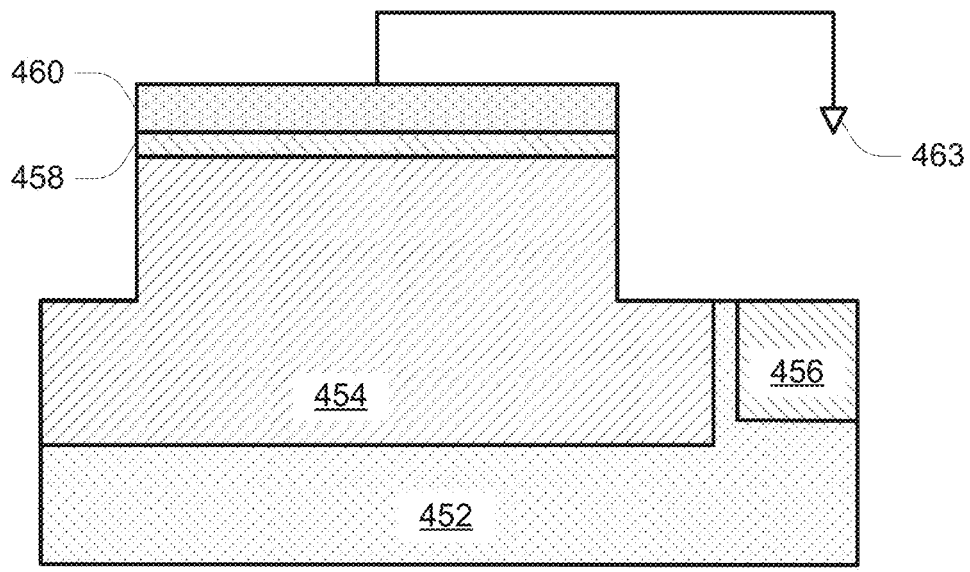

FIGS. 4A-4B are cross-sectional views of a capacitor of the related art to provide an example of such hazards. The capacitor of FIGS. 4A and 4B includes a first conductive region 454 formed in a semiconductor 452. The semiconductor 452 might have a first conductivity type. For example, the semiconductor 452 might be a p-type or n-type monocrystalline silicon or other semiconductor. The first conductive region 454 might have a second conductivity type, different than the first conductivity type, and might function as a first electrode of the capacitor. For example, where the semiconductor 452 is a p-type semiconductor, the first conductive region 454 might have an n-type conductivity. The capacitor of FIGS. 4A and 4B further includes a second conductive region 456 formed in the semiconductor 452. The second conductive region 456 might have the first conductivity type. Other circuitry of the integrated circuit device incorporating the capacitor of FIGS. 4A and 4B might be formed in the second conductive region 456.

The capacitor of FIGS. 4A and 4B further includes a dielectric 458 and a conductor 460. The dielectric 458 might generally be formed of one or more dielectric materials, while the conductor 460 might generally be formed of one or more conductive materials. The conductor 460 might function as a second electrode of the capacitor.

During fabrication of the capacitor, static charge 461 might be transferred to, and stored in, the first conductive region 454 as depicted in FIG. 4A. For example, plasma processing having a non-uniform plasma doping (PLAD) may produce static charge. Mechanically induced static charge may occur during chemical-mechanical planarization (CMP). Other fabrication processes might also lead to static charge build-up, such as non-uniform chemical vapor deposition (CVD), non-uniform dry etch plasma, non-uniform implant beam energy, etc. Regardless of the mechanism, such static charge 461 might be transferred to the first conductive region 454. This stored charge can lead to high voltage levels within the first conductive region 454, and may exceed 25V. However, due to a typically low tunneling barrier of the dielectric 458, the conductor 460 might be at a substantially similar voltage level. Subsequent processing might then result in the conductor 460 being connected to a ground node 463 as depicted in FIG. 4B. For example, conductive wet or plasma process may result in grounding of the conductor 460. Alternatively, grounding of the conductor 460 might occur during formation of additional conductors, such as metal layer formation. With the resulting voltage differential across the dielectric 458, the energy stored in the first conductive region 454 might be suddenly released through the dielectric 458, and may cause the first conductive region 454 to fuse with the conductor 460, creating a permanent capacitor short. Designs of the related art might typically provide for connecting the conductor 460 to a diode, e.g., a button diode, during subsequent processing in order to provide protection against static discharge. Such connections generally rely on the formation of an additional conductor, e.g., a metal line, connected to the conductor 460 and to the diode, which generally might occur subsequent to metal layer formation or other processing that could inadvertently ground the conductor 460 prior to connection to the diode. As such, this diode protection may not be available until after damage from static discharge has occurred.

Various embodiments provide capacitor structures to facilitate mitigation of uncontrolled release of stored energy from an electrode of the capacitor. Some embodiments provide for a reversed biased, e.g., N-P, junction between a first conductive region forming an electrode of the capacitor and having a conductivity type, e.g., an n-type conductivity, and a second conductive region having a different conductivity type, e.g., a p-type conductivity.

Figure 5A:
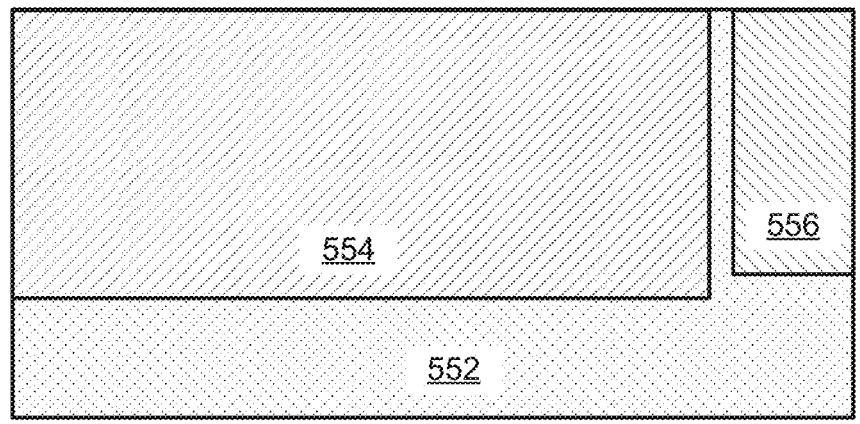
FIGS. 5A-5F are cross-sectional views of a capacitor structure in accordance with an embodiment at various stages of fabrication.

FIGS. 5A-5F are cross-sectional views of a capacitor structure in accordance with an embodiment at various stages of fabrication. FIG. 5A depicts a semiconductor 552, a first conductive region (e.g., well) 554 formed in the semiconductor 552, and a second conductive region (e.g., well) 556 formed in the semiconductor 552.

The semiconductor 552 might have a first conductivity type. For example, the semiconductor 552 might be a p-type or n-type monocrystalline silicon or other semiconductor. The first conductive region 554 might have a second conductivity type, different than the first conductivity type, and might function as a first electrode of the capacitor structure. For example, where the semiconductor 552 is a p-type semiconductor, the first conductive region 554 might have an n-type conductivity, such as an N+ conductivity. As is typical in integrated circuit fabrication, the "+" indicates higher levels of doping, e.g., sufficient to impart conductivity to this region of the semiconductor 552. The second conductive region 556 might have the first conductivity type, e.g., a p-type conductivity in this example, such as a P+ conductivity. Other circuitry of the integrated circuit device incorporating the capacitor structure of FIGS. 5A-5F might be formed in the second conductive region 556.

The first conductive region 554 and the second conductive region 556 might be formed by implanting respective dopant species into the semiconductor 552. As is well understood in the art, such implantation might commonly involve acceleration of ions directed at a surface of the semiconductor 552. To produce an n-type conductivity, the dopant species might include ions of arsenic (As), antimony (Sb), phosphorus (P) or another n-type impurity. To produce a p-type conductivity, the dopant species might include ions of boron (B) or another p-type impurity. Other methods of forming conductive regions in a semiconductor are known and embodiments herein are not limited to any method of forming the conductive regions.

Figure 5B:
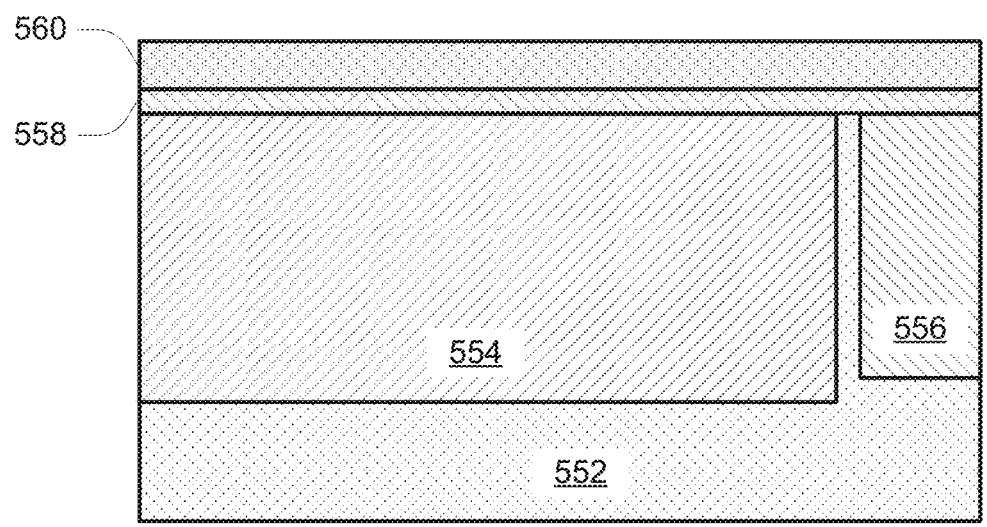

In FIG. 5B, a dielectric 558 might be formed overlying the first conductive region 554, the semiconductor 552 and the second conductive region 556. A conductor 560 might be formed overlying the dielectric 558. The conductor 560 may generally be formed of one or more conductive materials. For example, the conductor 560 may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material. The conductor 560 might have a conductivity type. As one example, the conductor 560 might be a conductively doped silicon material, e.g., a polycrystalline silicon commonly referred to as polysilicon. For such embodiments, the conductivity type might be either the first conductivity type or the second conductivity type.

The dielectric 558 may generally be formed of one or more dielectric materials. For example, the dielectric 558 may comprise, consist of, or consist essentially of an oxide, e.g., silicon dioxide, and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), yttrium oxide ($Y_2O_3$), etc., as well as any other dielectric material. As one example, the dielectric 558 might be a thermal oxide formed by reaction of an underlying silicon-containing first conductive region 554, semiconductor 552 and second conductive region 556.

Figure 5C:
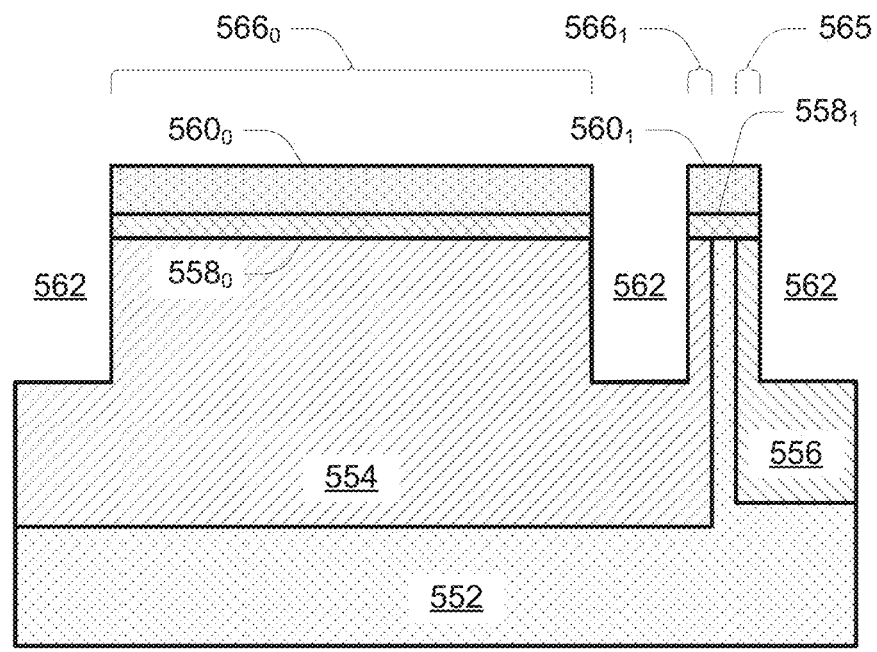
Figure 5D:
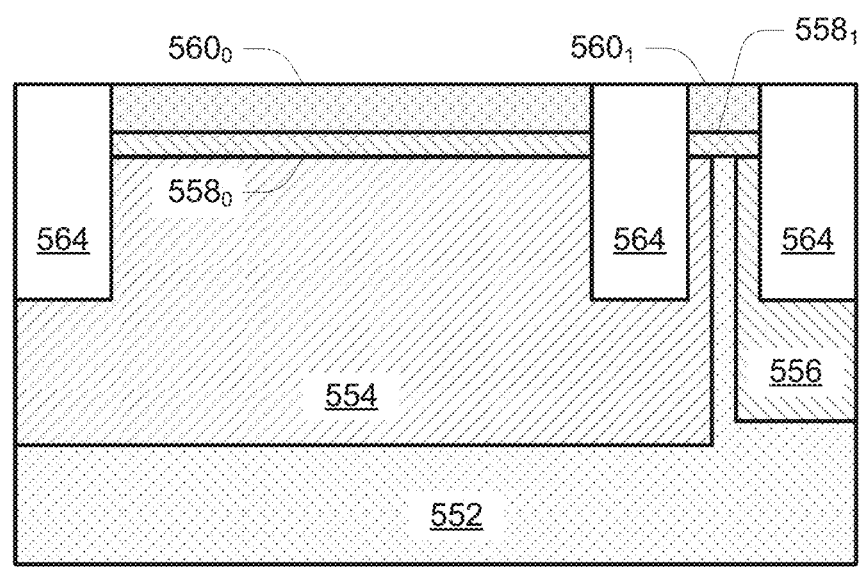

In FIG. 5C, the conductor 560, the dielectric 558, the first conductive region 554 and the second conductive region 556 might be patterned to form trenches 562. Patterning might include an isotropic etch or other suitable process or processes for removal of these materials. Formation of the trenches 562 might define a first island $566_0$ of the first conductive region 554, a second island $566_1$ of the first conductive region 554, an island 565 of the second conductive region 556, a first dielectric portion $558_0$ overlying the first island $566_0$ of the first conductive region 554, a second dielectric portion $558_1$ overlying the second island $566_1$ of the first conductive region 554 and overlying the island 565 of the second conductive region 556, a first conductor portion $560_0$ overlying the first dielectric portion $558_0$, and a second conductor portion $560_1$ overlying the second dielectric portion $558_1$. The first conductor portion $560_0$, the first dielectric portion $558_0$, and the first island $566_0$ of the first conductive region 554 might collectively form a capacitor of the capacitor structure of FIG. 5C. The trenches 562 might then be filled with a dielectric material to form isolation regions 564 as depicted in FIG. 5D. The isolation regions 564 might surround the first and second conductor portions $560_0$ and $560_1$ as depicted in FIG. 6.

Figure 5E:
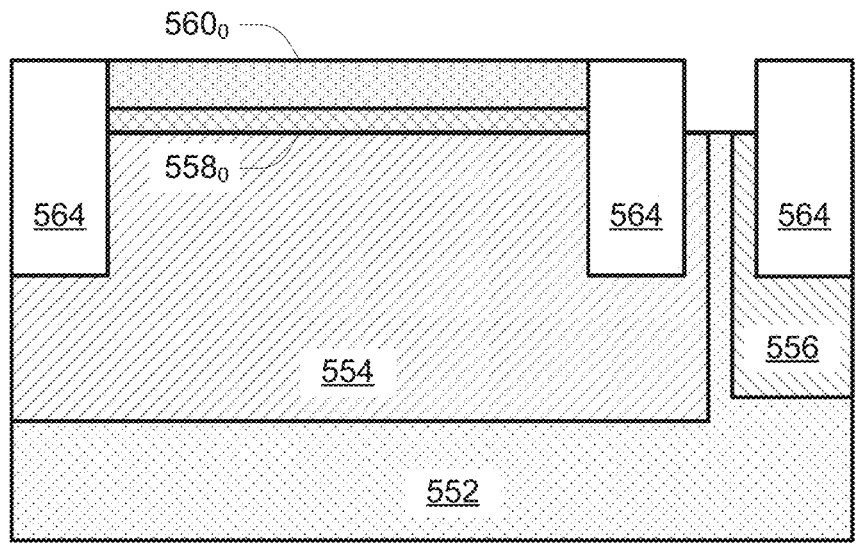
Figure 5F:
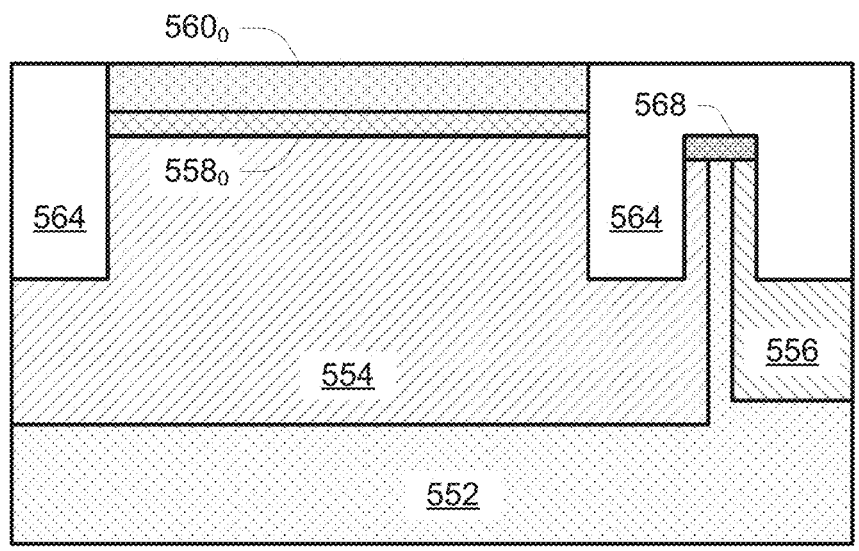

In FIG. 5E, the second conductor portion $560_1$ and the second dielectric portion $558_1$ might be removed to expose the second island $566_1$ of the first conductive region 554 and the island 565 of the second conductive region 556, as well as any portion of the semiconductor 552 between the second island $566_1$ of the first conductive region 554 and the island 565 of the second conductive region 556. In FIG. 5F, a third conductive region 568 might be formed in the second island $566_1$ of the first conductive region 554 and the island 565 of the second conductive region 556, as well as in any portion of the semiconductor 552 between the second island $566_1$ of the first conductive region 554 and the island 565 of the second conductive region 556. The third conductive region 568 might be formed by implanting a dopant species into these formations. The third conductive region 568 might have a same or different conductivity type as the first conductive region 554. Additional dielectric material might be formed overlying the third conductive region 568 to fill the gap depicted in FIG. 5E.

Figure 6:
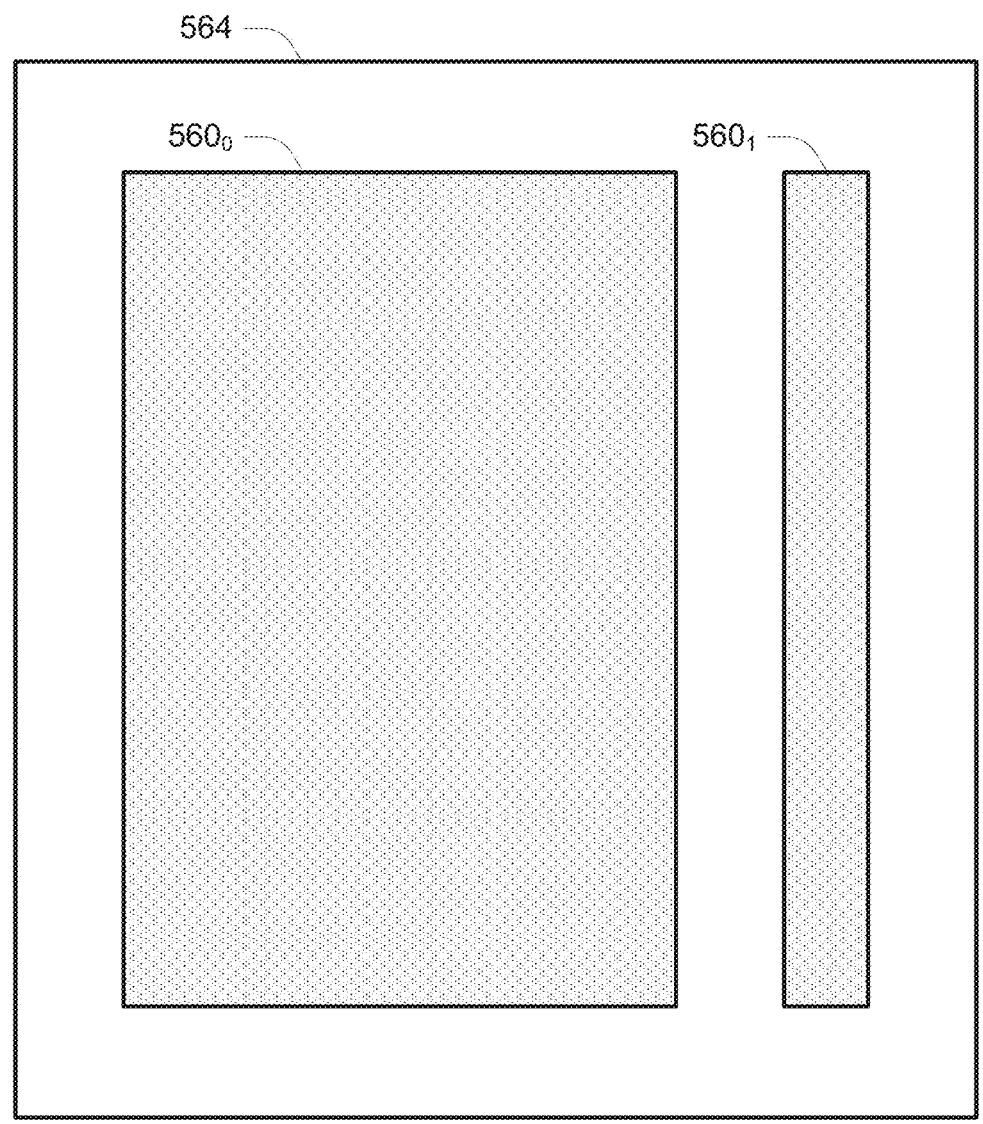
FIG. 6 is a plan view of the capacitor structure in accordance with an embodiment at a stage of fabrication corresponding to FIG. 5D.

FIG. 6 is a plan view of a capacitor structure in accordance with an embodiment at a stage of fabrication corresponding to FIG. 5D. In particular, FIG. 6 depicts the first conductor portion $560_0$ and the second conductor portion $560_1$ surrounded by isolation region 564. Although the first conductor portion $560_0$ and the second conductor portion $560_1$ are depicted as regular quadrilaterals in profile, other shapes might also be used. The first conductor portion $560_0$ might subsequently be connected to a conductor 346, e.g., conductor $346_1$, configured to provide a rail voltage, e.g., a top rail voltage, as described with reference to FIGS. 3A-3C for use of the capacitor structure as a decoupling capacitor. As another example, the first conductor portion $560_0$ might subsequently be connected to receive a clock signal CLK1 or CLK2, as described with reference to FIGS. 3D and 3E for use of the capacitor structure as a coupling capacitor. As a further example, the first conductor portion $560_0$ might subsequently be connected to a voltage node 349, as described with reference to FIGS. 3D and 3E for use of the capacitor structure as a storage capacitor.

Figure 7A:
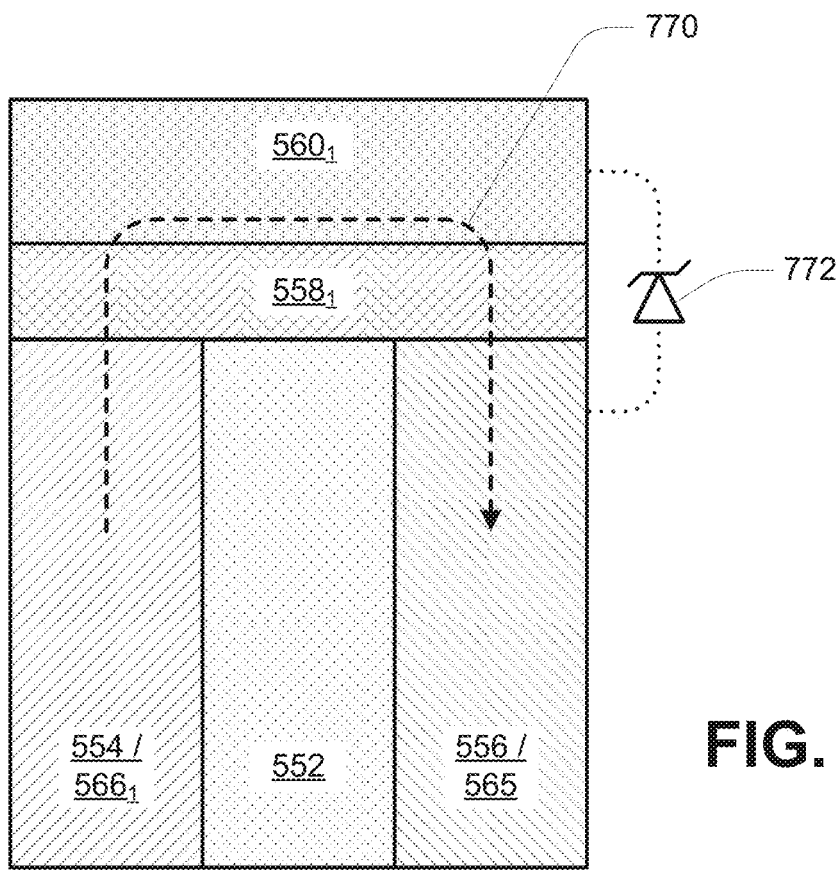
FIGS. 7A-7B are cross-sectional views of portions of capacitor structures in accordance with embodiments at a stage of fabrication corresponding to FIG. 5C.
Figure 7B:
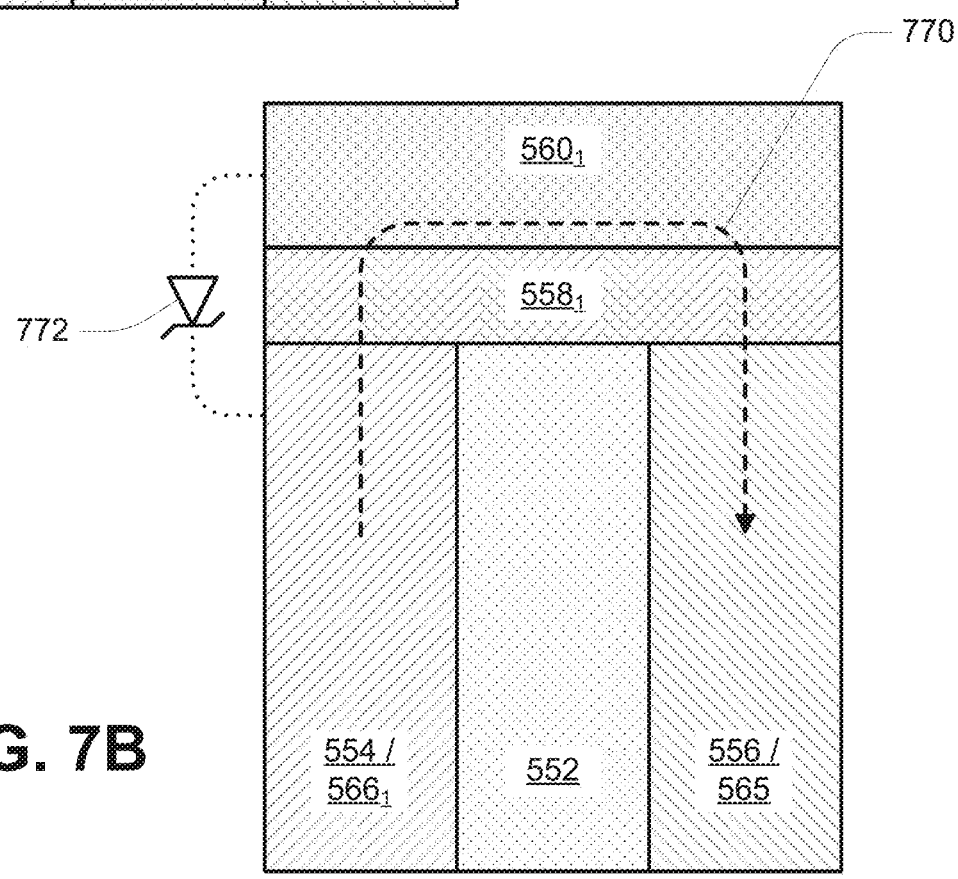

FIGS. 7A-7B are cross-sectional views of portions of capacitor structures in accordance with embodiments at a stage of fabrication corresponding to FIG. 5C. FIGS. 7A and 7B depict portions of the second island $566_1$ of the first conductive region 554 and the island 565 of the second conductive region 556, as well as any portion of the semiconductor 552 between the second island $566_1$ of the first conductive region 554 and the island 565 of the second conductive region 556 prior to removal of the second conductor portion $560_1$.

Using the common example of the first conductive region 554 having an N+ conductivity and the second conductive region 556 having a P+ conductivity, the second conductor portion $560_1$ of FIG. 7A might have an N+ conductivity, while the second conductor portion $560_1$ of FIG. 7B might have a P+ conductivity. In both cases, a conductive path 770 might be established from the first conductive region 554 to the second conductive region 556 through a diode 772, e.g., a reverse biased Zener diode, resulting between the second conductor portion $560_1$ and the island 565 of the second conductive region 556 in the case of FIG. 7A, or between the second island $566_1$ of the first conductive region 554 and the second conductor portion $560_1$ in the case of FIG. 7B. In both cases, the second conductor portion $560_1$ may form one terminal of the diode 772, while the island 565 of the second conductive region 556 or the second island $566_1$ of the first conductive region 554 might form the second terminal of the diode 772 for FIG. 7A or 7B, respectively.

Due to the nature of the doped junctions, a Zener voltage of the diode 772 might be expected to be less than, e.g., much less than, the breakdown voltage between the first conductive region 554 and the first conductor portion $560_0$, e.g., possibly around 5V versus 25-30V. As one example, the Zener voltage of the diode 772 might be in a range of 3-7V. As such, stored energy within the first conductive region 554 might be discharged to the second conductive region 556 through the diode 772 at a very early stage of fabrication without damage to the capacitor. Specifically, the stored energy within the first conductive region 554 might be discharged before connecting the first conductor portion $560_0$ to any other circuitry, e.g., while the first conductor portion $560_0$ might be isolated from other conductive materials. Damage to the second dielectric portion $558_1$ might be inconsequential as it may be considered sacrificial.

Figure 7C:
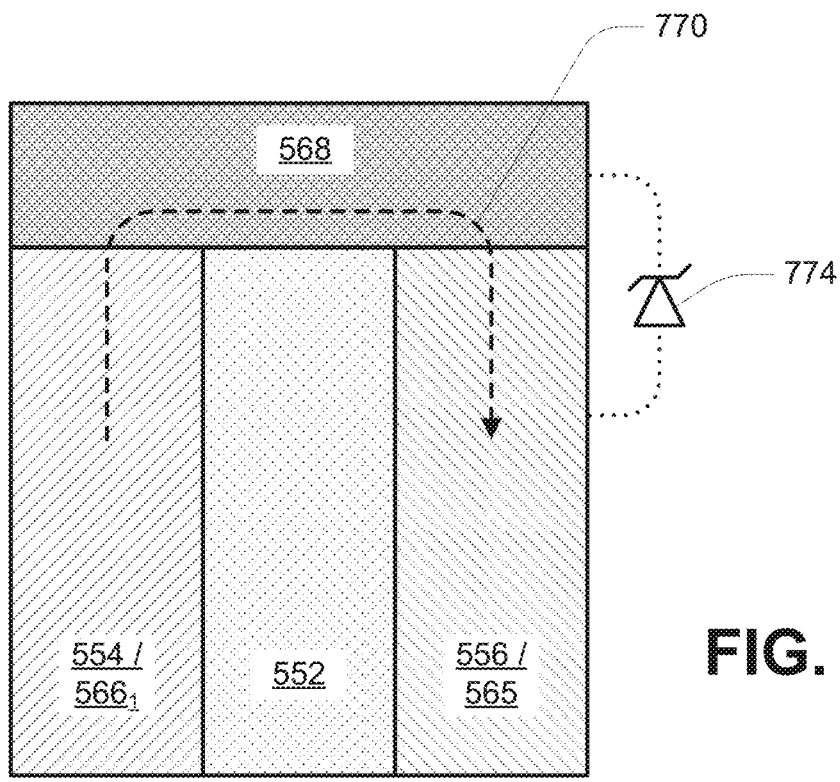
FIGS. 7C-7D are cross-sectional views of portions of capacitor structures in accordance with embodiments at a stage of fabrication corresponding to FIG. 5F.
Figure 7D:
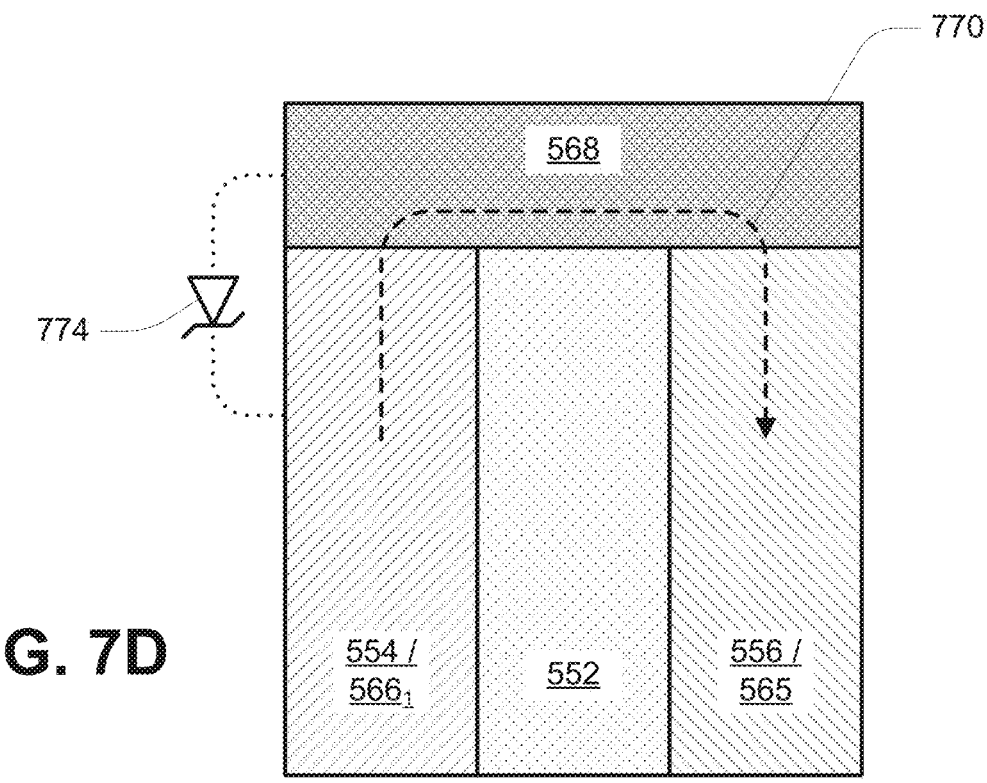

FIGS. 7C-7D are cross-sectional views of portions of capacitor structures in accordance with embodiments at a stage of fabrication corresponding to FIG. 5F. FIGS. 7C and 7D depict portions of the second island $566_1$ of the first conductive region 554 and the island 565 of the second conductive region 556, as well as any portion of the semiconductor 552 between the second island $566_1$ of the first conductive region 554 and the island 565 of the second conductive region 556 after formation of the third conductive region 568.

Using the common example of the first conductive region 554 having an N+ conductivity and the second conductive region 556 having a P+ conductivity, the third conductive region 568 of FIG. 7C might have an N+ conductivity, while the third conductive region 568 of FIG. 7D might have a P+ conductivity. In both cases, a conductive path 770 might be established from the first conductive region 554 to the second conductive region 556 through a diode 774, e.g., a reverse biased Zener diode, resulting between the third conductive region 568 and the island 565 of the second conductive region 556 in the case of FIG. 7C, or between the second island $566_1$ of the first conductive region 554 and the third conductive region 568 in the case of FIG. 7D. In both cases, the third conductive region 568 may form one terminal of the diode 774, while the island 565 of the second conductive region 556 or the second island $566_1$ of the first conductive region 554 might form the second terminal of the diode 774 for FIG. 7C or 7D, respectively. For reasons similar to those presented with respect to FIGS. 7A and 7B, this structure might likewise continue to provide protection of the capacitor before and after connecting the first conductor portion $560_0$ to any other circuitry.

Figure 8:
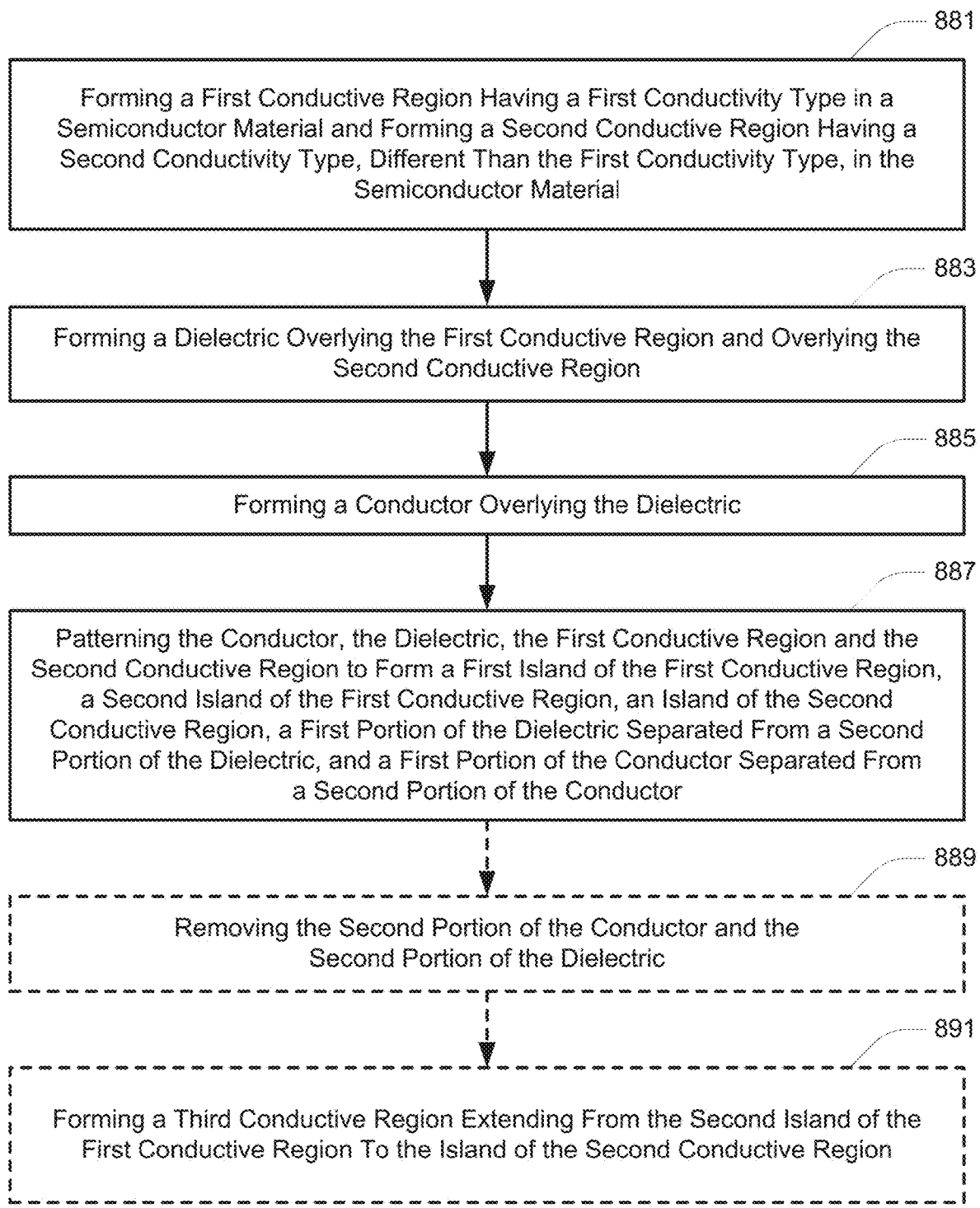
FIG. 8 is a flowchart of a method of forming a capacitor structure in accordance with embodiments.

FIG. 8 is a flowchart of a method of forming a capacitor structure in accordance with embodiments. At 881, a first conductive region having a first conductivity type might be formed in a semiconductor material, and a second conductive region having a second conductivity type, different than the first conductivity type, might be formed in the semiconductor material. The semiconductor material might have the first conductivity type or the second conductivity type.

At 883, a dielectric might be formed overlying the first conductive region and overlying the second conductive region. At 885, a conductor might be formed overlying the dielectric.

At 887, the conductor, dielectric, first conductive region and second conductive region might be patterned to form a first island of the first conductive region, a second island of the first conductive region, an island of the second conductive region, a first portion of the dielectric separated from a second portion of the dielectric, and a first portion of the conductor separated from a second portion of the conductor.

Optionally, at 889, the second portion of the conductor and the second portion of the dielectric might be removed, and, at 891, a third conductive region extending from the second island of the first conductive region to the island of the second conductive region might be formed. The third conductive region might have the first conductivity type or the second conductivity type.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A capacitor structure, comprising:
a first conductive region having a first conductivity type, the first conductive region comprising a first protrusion portion and a second protrusion portion;
a second conductive region having a second conductivity type different than the first conductivity type, the second conductive region comprising a third protrusion portion;
a first dielectric material overlying the first protrusion portion of the first conductive region;
a first conductor material overlying the first dielectric material; and
a terminal of a diode overlying the second protrusion portion of the first conductive region and the third protrusion portion of the second conductive region, the terminal of the diode comprising a second conductor material isolated from the first conductor material.

2. The capacitor structure of claim 1, wherein:
the first conductive region comprises n-type doped silicon material; and
the second conductive region comprises p-type doped silicon material.

3. The capacitor structure of claim 2, wherein the terminal of the diode comprises one of:
additional n-type doped silicon material; and
additional p-type doped silicon material.

4. The capacitor structure of claim 1, wherein:
the first conductive region comprises p-type doped silicon material; and
the second conductive region comprises n-type doped silicon material.

5. The capacitor structure of claim 1, wherein the terminal of the diode further comprises a second dielectric material positioned between each of:
the second conductor material and the second protrusion portion of the first conductive region; and
the second conductor and the protrusion portion of the second conductive region.

6. The capacitor structure of claim 5, wherein the second dielectric material has the same composition as the first dielectric material.

7. The capacitor structure of claim 1, wherein the first dielectric material comprises thermal oxide material of the first protrusion portion of the first conductive region.

8. The capacitor structure of claim 1, wherein the diode is a Zener diode between the terminal of the diode and one of the second protrusion portion of the first conductive region and the third protrusion portion of the second conductive region.

9. A capacitor structure, comprising:
a first conductively doped region of a semiconductor material, the first conductively doped region having a first conductivity type and comprising a first protrusion portion and a second protrusion portion;
a second conductively doped region of the semiconductor material, the second conductively doped region having a second conductivity type different than the first conductivity type and comprising a third protrusion portion;
a dielectric material overlying the first protrusion portion of the first conductively doped region;
a first conductor material overlying the dielectric material; and
a terminal of a diode configured to be a portion of a conductive path between the second protrusion portion of the first conductively doped region and the third protrusion portion of the second conductively doped region, the terminal of the diode comprising a second conductor material, the terminal of the diode overlying the second protrusion portion of the first conductively doped region and the third protrusion portion of the second conductively doped region.

10. The capacitor structure of claim 9, wherein the semiconductor material has a different conductivity type than the first conductivity type.

11. The capacitor structure of claim 9, wherein the terminal of the diode further overlies a portion of the semiconductor material between the second protrusion portion of the first conductively doped region and the third protrusion portion of the second conductively doped region.

12. The capacitor structure of claim 9, wherein the portion of the conductive path is formed in response to a discharge of static energy stored by the first conductively doped region to the second conductively doped region.

13. The capacitor structure of claim 9, wherein:
the first conductively doped region comprises n-type doped semiconductor material;
the second conductively doped region comprises a p-type doped semiconductor material; and
the second conductor material of the terminal of the diode comprises one of n-type doped polysilicon and p-type doped polysilicon.

14. The capacitor structure of claim 9, wherein:
the first protrusion portion of the first conductively doped region forms a first electrode of a capacitor of the capacitor structure; and
the first conductor material forms a second electrode of the capacitor of the capacitor structure.

15. The capacitor structure of claim 9, wherein a second terminal of the diode is one of:
the second protrusion portion of the first conductively doped region; and
the third protrusion portion of the second conductively doped region.

16. A capacitor structure, comprising:
a region of n-type doped silicon material comprising a first protrusion portion and a second protrusion portion, the first protrusion portion forming a first electrode of a capacitor; a
a region of p-type doped silicon material comprising a third protrusion portion;
dielectric structure overlying the first protrusion portion;
a first conductively doped silicon material overlying the dielectric structure, the first conductively doped silicon material forming a second electrode of the capacitor; and
a second conductively doped silicon material overlying and in direct contact with the second protrusion portion and the third protrusion portion.

17. The capacitor structure of claim 16, wherein the capacitor comprises one of a coupling capacitor, a decoupling capacitor, and a storage capacitor.

18. The capacitor structure of claim 16, wherein the capacitor is part of peripheral circuitry for a three-dimensional NAND memory array.

19. The capacitor structure of claim 16, wherein the first conductively doped silicon material is coupled to a node configured to receive a supply voltage from an external device.

* * * * *